(12) United States Patent
Yudin et al.

(10) Patent No.: US 11,509,117 B2
(45) Date of Patent: Nov. 22, 2022

(54) LIGHT EMITTING ELEMENT

(71) Applicant: SHARP KABUSHIKI KAISHA, Sakai (JP)

(72) Inventors: Alex Yudin, Abingdon (GB); Yoshimi Tanimoto, Sakai (JP); Yoshihiko Tani, Sakai (JP); Valerie Berryman-Bousquet, Chipping Norton (GB)

(73) Assignee: SHARP KABUSHIKI KAISHA, Sakai (JP)

( * ) Notice: Subject to any disclaimer, the term of this patent is extended or adjusted under 35 U.S.C. 154(b) by 443 days.

(21) Appl. No.: 16/737,205

(22) Filed: Jan. 8, 2020

(65) Prior Publication Data
US 2020/0227892 A1  Jul. 16, 2020

Related U.S. Application Data

(60) Provisional application No. 62/792,148, filed on Jan. 14, 2019.

(51) Int. Cl.
*H01S 5/22* (2006.01)
*H01S 5/40* (2006.01)

(52) U.S. Cl.
CPC .............. *H01S 5/22* (2013.01); *H01S 5/2219* (2013.01); *H01S 5/4031* (2013.01); *H01S 5/4087* (2013.01)

(58) Field of Classification Search
CPC ........ H01S 5/22; H01S 5/2219; H01S 5/4031; H01S 5/4087; H01S 5/04256; H01S 5/34333; H01S 2301/176
See application file for complete search history.

(56) References Cited

U.S. PATENT DOCUMENTS

| | | | |
|---|---|---|---|
| 5,982,799 A | 11/1999 | Bour et al. | |
| 8,638,828 B1* | 1/2014 | Raring | H01S 5/34 372/50.12 |
| 9,100,590 B2 | 8/2015 | Raring et al. | |
| 2005/0069006 A1 | 3/2005 | Tatsumi | |
| 2010/0111129 A1* | 5/2010 | Nakashima | H01S 5/4031 372/46.012 |
| 2010/0290498 A1* | 11/2010 | Hata | B82Y 20/00 372/50.12 |
| 2012/0273816 A1* | 11/2012 | Yoshida | H01S 5/4087 257/E33.025 |
| 2017/0237880 A1 | 8/2017 | Saracco et al. | |

FOREIGN PATENT DOCUMENTS

JP  H08-107254 A  4/1996
JP  2005-109089 A  4/2005

* cited by examiner

*Primary Examiner* — Yuanda Zhang
(74) *Attorney, Agent, or Firm* — ScienBiziP, P.C.

(57) ABSTRACT

A light emitting element (semiconductor laser element) includes a multilayer structure in which a substrate, semiconductor layers to, an insulating layer, and a metal layer are stacked in order. The light emitting element includes a plurality of light emitting portions each of which emits a laser beam. The plurality of light emitting portions each include a ridge (ridge waveguide). The distance from a specific position in an active region in at least one of the light emitting portions to an inner surface of the metal layer is different from that in another of the light emitting portions.

7 Claims, 11 Drawing Sheets

LIGHT EMITTING ELEMENT

BACKGROUND

1. Field

The present disclosure relates to a light emitting element that emits a laser beam.

2. Description of the Related Art

Semiconductor laser elements are widely used as light emitting elements that emit laser beams. In particular, multi-stripe semiconductor laser elements, each of which can emit a plurality of laser beams having different wavelengths from a single light emitting element, are used for various purposes.

For example, US Patent Application No. 2017/0237880 describes a laser scanning projector in which a multi-stripe semiconductor laser element is used in order to improve brightness and resolution. U.S. Pat. No. 9,100,590 describes a projection system in which a multi-stripe semiconductor laser element is used in order to reduce the size and the number of components of a projector.

However, US Patent Application No. 2017/0237880 does not describe a specific structure of a semiconductor laser element for emitting laser beams having a plurality of wavelengths. The semiconductor laser element disclosed in U.S. Pat. No. 9,100,590 has a structure such that, for example, the concentration of a semiconductor in an active layer is varied, which makes it difficult to manufacture the semiconductor laser element and to adjust the wavelength.

It is desirable to realize a multi-stripe semiconductor laser element having a simple structure.

SUMMARY

According to an aspect of the disclosure, there is provided a light emitting element having a multilayer structure in which a substrate, a semiconductor layer, an insulating layer, and a metal layer are stacked in order. The light emitting element includes a plurality of light emitting portions each of which has a part of the multilayer structure and emits a laser beam. The plurality of light emitting portions each include a ridge including a part of the semiconductor layer, a part of the insulating layer, and a part of the metal layer, and an active region, for emitting the laser beam by stimulated emission, is formed in the semiconductor layer included in a part of the multilayer structure. In each of the plurality of ridges, in a sectional view defined by a direction parallel to a surface of the metal layer, parts of the insulating layer are disposed on both sides of a part of the semiconductor layer, and parts of the metal layer are disposed on both sides of a part of the insulating layer. Among the plurality of light emitting portions, a distance in at least one of the light emitting portions from a specific position in the active region to a part or an entirety of an inner surface of the metal layer is different from a distance in another of the light emitting portions from the specific position to the inner surface of the metal layer.

DESCRIPTION OF THE EMBODIMENTS

First Embodiment

Structure of Semiconductor Laser Element

Figure 1:
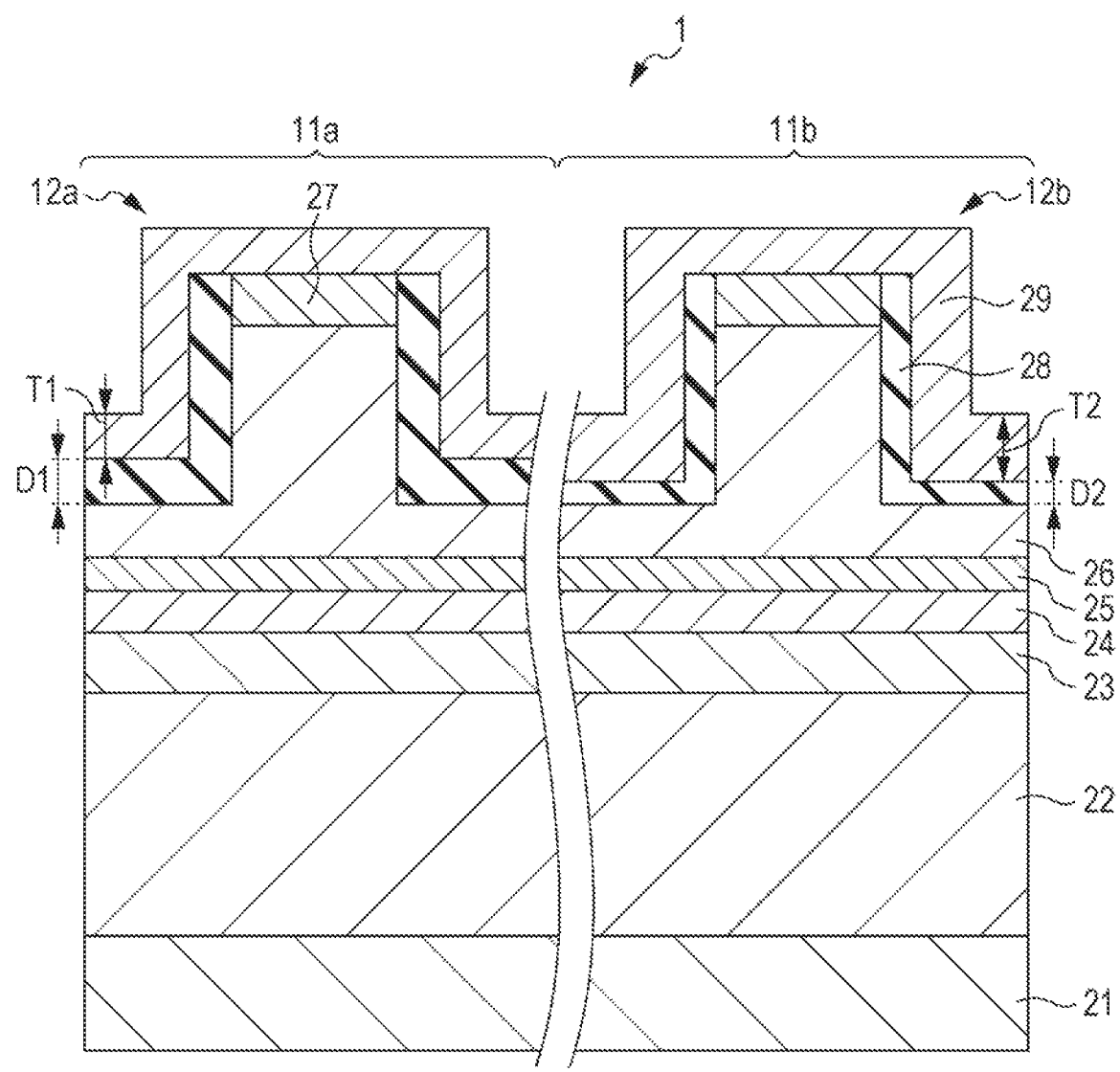
FIG. 1 is a sectional view schematically illustrating a cross-sectional structure of a semiconductor laser element according to a first embodiment.

Referring to FIGS. 1 to 6, an embodiment of the present disclosure will be described. FIG. 1 is a sectional view schematically illustrating a cross-sectional structure of a semiconductor laser element (light emitting element) 1 according to the present embodiment. As illustrated in FIG. 1, the semiconductor laser element 1 has a multilayer structure in which a substrate 21, semiconductor layers 22 to 27, an insulating layer 28, and a metal layer 29 are stacked in order.

The semiconductor laser element 1 includes two light emitting portion 11a and 11b each of which has a part of the multilayer structure and emits a laser beam. In the present description, the light emitting portion 11a and the light emitting portion 11b may be collectively referred to as a light emitting portion 11. A portion of the semiconductor laser element 1 between the light emitting portion 11a and the light emitting portion 11b may have a plurality of variations, such as a variation in which a groove 340 described below (see FIG. 10) is provided in the portion. Therefore, the details of this portion will be described in a third embodiment. Thus, in FIG. 1, in order to avoid confusion of description, the portion between the light emitting portion 11a and the light emitting portion 11b is omitted by using double wave lines. Regarding the omission using the double wave lines, the same applies to FIGS. 7 and 9.

The light emitting portion 11a and the light emitting portion 11b respectively include a ridge waveguide (ridge) 12a and a ridge waveguide 12b each of which includes a part of each of the semiconductor layers 22 to 27, a part of the insulating layer 28, and a part of the metal layer 29. In the present description, the ridge waveguide 12a and the ridge waveguide 12b may be collectively referred to as a ridge waveguide 12.

In the ridge waveguide 12, in a sectional view defined by a direction parallel to a surface of the metal layer 29, parts of the insulating layer 28 are disposed on both sides of a part of the semiconductor layers 22 to 27, and parts of the metal layer 29 are disposed on both sides of a part of the insulating layer 28. The metal layer 29 is disposed also on a surface of the ridge waveguide 12. The semiconductor laser element 1 may include any number of light emitting portions 11, each of which includes the ridge waveguide 12, as long as the number is two or more. The ridge waveguide 12 is formed in each of the light emitting portions 11. That is, the semiconductor laser element 1 is a multi-stripe semiconductor laser element.

A laser beam emitted by stimulated emission in the light emitting portion 11 is confined between two cleaved facets extending in a direction perpendicular to the longitudinal direction of the ridge waveguide 12 and is amplified as the laser beam reciprocates between the cleaved facets. Preferably, the width of the ridge waveguide 12 in the transversal direction of is 0.8 μm or larger and 2.5 μm or smaller. Such a width is preferable, because, with such a width, the trade-off between the difference in laser oscillation wavelength between the light emitting portions 11a and 11b according to the present disclosure and the laser emission efficiency is optimal.

A part of the light emitting portion 11 interposed between the two cleaved facets serves as a laser resonator of the semiconductor laser element 1. At the cleaved facets, aluminum oxynitride, $SiN_x$, $SiO_2$, $Al_2O_3$, or the like may be formed in order to adjust the reflectivity against the laser beam.

Substrate and Metal Layer

Electrodes (not shown in FIG. 1) are connected to the substrate 21 and the metal layer 29. The substrate 21 and the metal layer 29 are each made of an electroconductive material. The substrate 21 may be made of, for example, GaN, Si, SiC, or the like. The metal layer 29 may be made of, for example, a metal such as Au, Ti, Pd, Pt, Mo, or Ni. The metal layer 29 may be a single layer or a multi-layer composed of a plurality of metal layers. For example, the metal layer 29 may be formed by additionally forming a metal layer of Au on a metal layer of Ti.

Semiconductor Layers

The semiconductor layers 22 to 27 are each made of a III-V compound semiconductor. At least one element selected from a group consisting of Al, In, and Ga may be used as a group III element, and at least one element selected from a group consisting of N, As, and P may be used as a group V element. To be more specific, the semiconductor layers 22 to 27 are each a III-V compound semiconductor made of GaN, AlGaN, InGaN, GaAs, AlGaAs, AlGaInP, AlInP, GaInP, or the like.

The semiconductor layers 22 to 27 each may include, as a dopant material, Si, Mg, or the like; or may not include such a material on purpose. In each of the semiconductor layers 22 to 27, a combination of the III-V group elements, the composition of the elements, a selection of a dopant material, and the amount of the dopant material may be determined in various ways in accordance with the function thereof.

Semiconductor layers according to the present disclosure are not limited to the semiconductor layers 22 to 27 illustrated in FIG. 1. A plurality of semiconductor layers may be added to or omitted from the semiconductor layers 22 to 27.

The semiconductor layers 22 to 27 can be divided into, for example, n-type semiconductor layers 22 and 23, an active region 24, and p-type semiconductor layers 25 to 27, which are stacked in order. The n-type semiconductor layers 22 and 23 can be further divided into an n-type cladding layer 22 and an n-type guide layer 23.

As the n-type cladding layer 22, for example, an n-type AlGaN layer doped with Si, an n-type GaN layer doped with Si, or a superlattice structure that is a combination of these layers may be used. The n-type cladding layer 22 is designed so that the refractive index thereof is lower than the effective refractive index of light in the light emitting portion 11.

As the n-type guide layer 23, for example, an n-type InGaN layer doped with Si or an undoped InGaN layer may be used. The n-type guide layer 23 is designed so that the refractive index thereof is higher than the effective refractive index of light in the light emitting portion 11. Preferably, a dopant is not added to the n-type guide layer 23, because, in this case, absorption of light by free carriers is suppressed and the laser efficiency is improved.

The p-type semiconductor layers 25 to 27 can be divided into a p-type guide layer 25, a p-type cladding layer 26, and a p-type contact layer 27.

As the p-type guide layer 25, for example, a p-type InGaN layer doped with Mg or an undoped InGaN layer may be used. The p-type guide layer 25 is designed so that the refractive index thereof is higher than the effective refractive index of light in the light emitting portion 11. Preferably, a dopant is not added to the p-type guide layer 25, because, in this case, absorption of light by free carriers is suppressed and the laser efficiency is improved.

As the p-type cladding layer 26, for example, a p-type AlGaN layer doped with Mg, a p-type GaN layer doped with Mg, or a superlattice structure that is a combination of these layers may be used. The p-type cladding layer 26 is designed so that the refractive index thereof is lower than the effective refractive index of light in the light emitting portion 11.

Here, in a case of a general nitride semiconductor laser, a carrier blocking layer, which is made of p-type AlGaN, is usually provided between and in contact with the p-type guide layer 25 and the p-type cladding layer 26. The Al composition ratio of the carrier blocking layer is designed so that the band-gap energy of the carrier blocking layer is larger than those of the p-type guide layer 25 and the p-type cladding layer 26.

Although the carrier blocking layer preemptively blocks movement of electrons from the p-type guide layer 25 to the p-type cladding layer 26, the carrier blocking layer does not particularly influence movement of positive holes from the p-type cladding layer 26 to the p-type guide layer 25. By providing such a carrier blocking layer, confinement of carriers in the active region 24 is performed more efficiently. The carrier blocking layer may be provided also in the semiconductor laser element 1 according to the present embodiment.

Thus, with a double heterostructure in which the n-type cladding layer 22 and the n-type guide layer 23, and the p-type guide layer 25 and the p-type cladding layer 26 are formed so that the active region 24 is interposed therebetween, carriers and light can be efficiently confined in the active region 24. Therefore, stimulated emission light can be efficiently generated from the active region 24. Moreover, because the n-type guide layer 23 and the p-type guide layer 25 each have a refractive index higher than the effective refractive index of light in the light emitting portion 11, the stimulated emission light can be efficiently confined in a direction perpendicular to the active region 24.

The dopant concentration of Mg or the like in the p-type contact layer 27 is higher than that in the p-type cladding layer 26. By providing such a p-type contact layer 27 at a contact portion with the metal layer 29, contact resistance between the p-type contact layer 27 and the metal layer 29 can be reduced, and a current can be made to efficiently flow into the light emitting portion 11. Although not illustrated, a layer made of Pd or Ni may be inserted so as to be interposed between and in contact with the p-type contact layer 27 and the metal layer 29 in an upper part of the ridge waveguide 12. By providing such a layer, the contact resistance can be further reduced.

Active Region

The active region 24 is a layer for emitting a laser beam by stimulated emission in the light emitting portion 11. When a voltage is applied to the active region 24, positive holes, which are carriers, and electrons recombine, thereby generating stimulated emission light.

Figure 2:
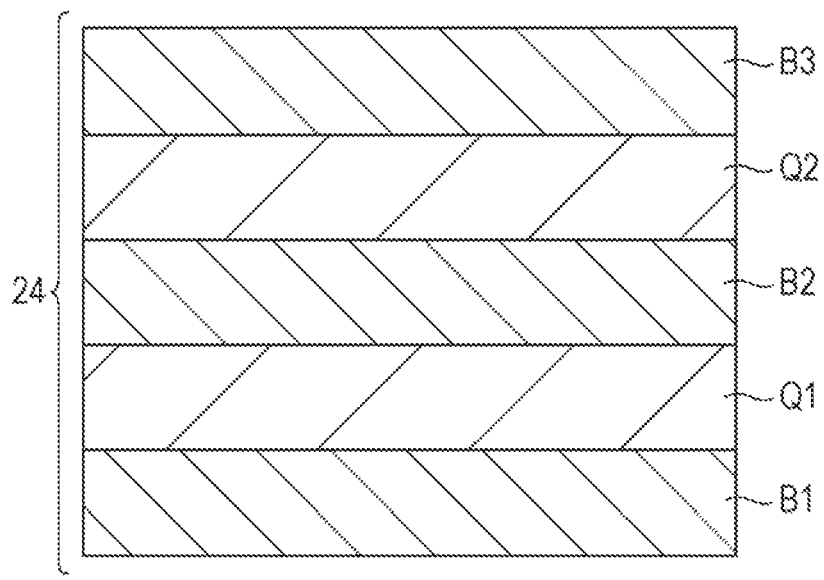
FIG. 2 is a sectional view schematically illustrating a cross-sectional structure of an active region of the semiconductor laser element according to the first embodiment.

FIG. 2 is a sectional view schematically illustrating a cross-sectional structure of the active region 24. As illustrated in FIG. 2, the active region 24 is composed of two quantum well layers Q1 and Q2 and three barrier layers B1, B2, and B3. The quantum well layer Q1 is stacked so as to be interposed between the barrier layer B1 and the barrier layer B2, and the quantum well layer Q2 is stacked so as to be interposed between the barrier layer B2 and the barrier layer B3.

Thus, the active region 24 has a multiple quantum well structure including a plurality of quantum well layers. With such a structure, light emission efficiency can be improved due to the plurality of quantum well layers. Preferably, two or more quantum well layers are formed in the active region 24. However, only one quantum well layer may be formed.

The quantum well layers Q1 and Q2 are made of, for example, $In_{x1}Ga_{1-x1}N$ or the like. The quantum well layers Q1 and Q2 may have the same thickness and the same composition or may have different thicknesses and different compositions. The barrier layers B1, B2, and B3 may be made of, for example, $In_{x2}Ga_{1-x2}N$ or the like. Preferably, In is not included, that is, X2=0. Thus, the crystal quality of the barrier layers B1, B2, and B3 is improved and the surfaces of these layers become smooth, and therefore stacking of further layers can be performed easily.

One or more layers in the active region 24 may include a dopant or no dopant. When the active region 24 includes a dopant, the injection efficiency of carriers increases, and the threshold current density can be lowered. As the dopant, Si, Ge, O, S, Se, Be, Cd, or Mg may be used.

Preferably, the active region 24 does not include a dopant, because, in this case, the crystal quality of the active region is improved, and the light output efficiency of the device with respect to current is improved.

Insulating Layer

The insulating layer 28 is a layer for limiting the path of a current, which flows from the metal layer 29 into the semiconductor layers 22 to 27, to a predetermined path. The insulating layer 28 is made of a light-transmissive insulating material. Examples of such a material include $SiN_x$, $SiO_2$, and $Al_2O_3$. Although the insulating layer 28 is formed on side surfaces of the ridge waveguide 12, the insulating layer 28 is not formed on at least a part of the surface of the ridge waveguide 12 on which the p-type contact layer 27 is stacked. Therefore, the path of a current that flows from the metal layer 29 into the semiconductor layers 22 to 27 is limited to a portion where the p-type contact layer 27 and the metal layer 29 are in contact with each other. With such a structure, the light emitting portion 11a and the light emitting portion 11b can be electrically separated from each other.

Preferably, the light absorption coefficient, which is an indicator of light transmissivity, of the insulating layer 28 is 1/100 of that of the metal layer 29 or lower. With such a structure, the insulating layer 28 does not significantly influence the light absorption loss in the light emitting portion 11.

Regarding Crosstalk Between Light Beams Emitted from Light Emitting Portions

In order to reduce fluctuations in the output power of laser beams emitted from the light emitting portion 11a and the light emitting portion 11b, preferably, the crosstalk between light beams emitted from the light emitting portions is reduced. For this purpose, preferably, the distance W0 between two side surfaces, which face each other, of the p-type semiconductor layer 26 of the two adjacent ridge waveguides 12a and 12b is a predetermined length or larger. In this case, a laser beam emitted from one light emitting portion (for example, the light emitting portion 11a) is sufficiently absorbed by a semiconductor layer that is present between the light emitting portions 11 before the laser beam propagates to the other light emitting portion (for example, the light emitting portion 11b). Preferably, the distance W0 is 20 μm or larger and 50 μm or smaller.

In the present embodiment, the thickness D1 of the insulating layer 28 of the light emitting portion 11a is different from the thickness D2 of the insulating layer 28 of the light emitting portion 11b. The thickness T1 of the metal layer 29 of the light emitting portion 11a may be the same as or different from the thickness T2 of the metal layer 29 of the light emitting portion 11b.

Thus, among the light emitting portion 11a and the light emitting portion 11b, the distance in at least one of the light emitting portions (for example, the light emitting portion 11a) from a specific position in the active region 24 to a part or the entirety of the inner surface of the metal layer 29 is different from the distance in another of the light emitting portions (for example, the light emitting portion 11b) from the specific position to the inner surface of the metal layer 29. The specific position is a position in the active region 24 to which carriers are injected and at which light is generated.

With such a structure, a laser beam emitted from the light emitting portion 11a and a laser beam emitted from the light emitting portion 11b can have different wavelengths. Hereafter, the principle behind the emission of laser beams having different wavelengths will be described.

Principle Behind Emission of Laser Beams Having Different Wavelengths

Figure 3A:
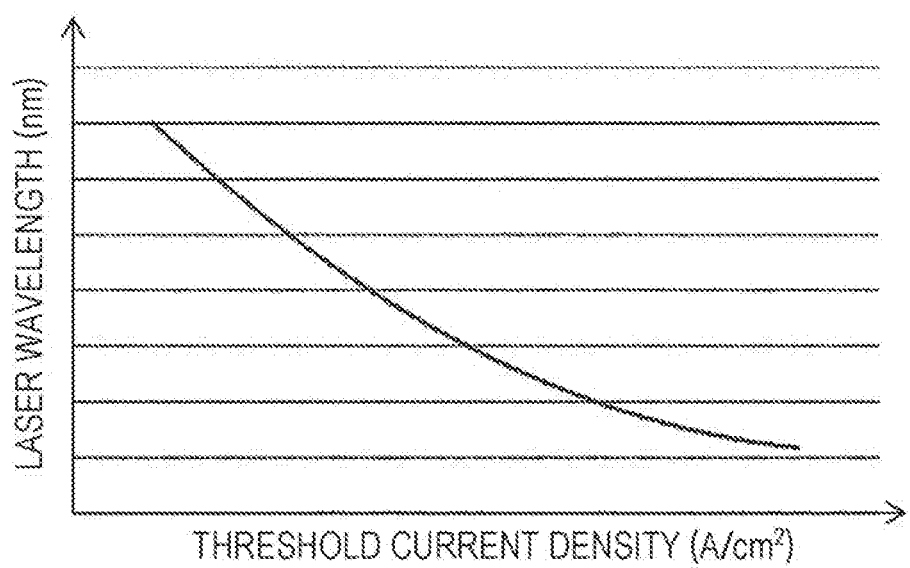
FIG. 3A is a graph illustrating a correlation between a threshold current density and the wavelength of a laser beam.

FIG. 3A is a graph illustrating a correlation between a threshold current density and the wavelength of a laser beam. As illustrated in FIG. 3A, the wavelength of a laser beam emitted from a laser light emitting portion is correlated to the threshold current density in the light emitting portion.

Figure 4A:
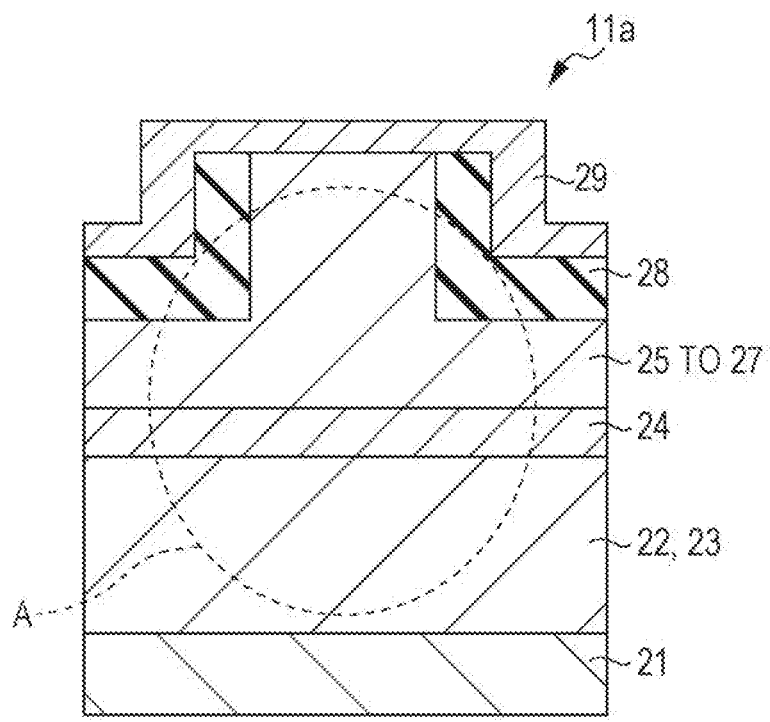
FIG. 4A is a sectional view schematically illustrating a cross-sectional structure of one light emitting portion of the semiconductor laser element according to the first embodiment.
Figure 4B:
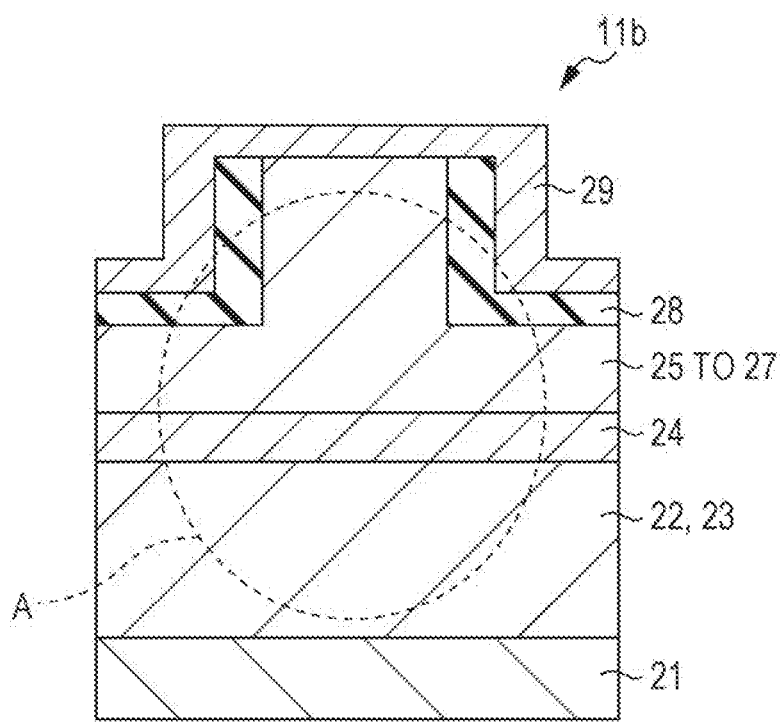
FIG. 4B is a sectional view schematically illustrating a cross-sectional structure of the other light emitting portion of the semiconductor laser element.

Here, the threshold current density in the light emitting portion is dependent on the light absorption loss in the light emitting portion. FIG. 4A is a sectional view schematically illustrating a cross-sectional structure of the light emitting portion 11a, and FIG. 4B is a sectional view schematically illustrating a cross-sectional structure of the light emitting portion 11b. In FIGS. 4A and 4B, regions surrounded by dotted lines each schematically illustrate a range A of a laser beam that is included in the half-width of the intensity distribution of the laser beam in the light emitting portion 11. The half-width may be, for example, the full width at half maximum (FWHM), the $1/e^2$ width, or the like.

In FIG. 4 and the following figures, regarding the semiconductor layers 22 to 27 of the semiconductor laser element 1, only a p-type semiconductor layer, an active region, and an n-type semiconductor layer are illustrated for simplicity. However, this does not mean that the p-type semiconductor layer and the n-type semiconductor layer are each formed of a single semiconductor layer. The p-type semiconductor layer and the n-type semiconductor layer may each be divided into two or more of a guide layer, a cladding layer, and a contact layer.

The metal layer 29 is usually made of a material having low light transmissivity, that is, high light absorptivity. Therefore, as overlap between the range A of light and the metal layer 29 increases, the light absorption loss in the light emitting portion 11 increases. In the present embodiment, the overlap between the range A of light and the metal layer 29 changes in accordance with the thickness of the insulating layer 28. This is because the distance from the specific position in the active region 24 to the inner surface of the metal layer 29 changes in accordance with the thickness of the insulating layer 28.

Figure 3B:
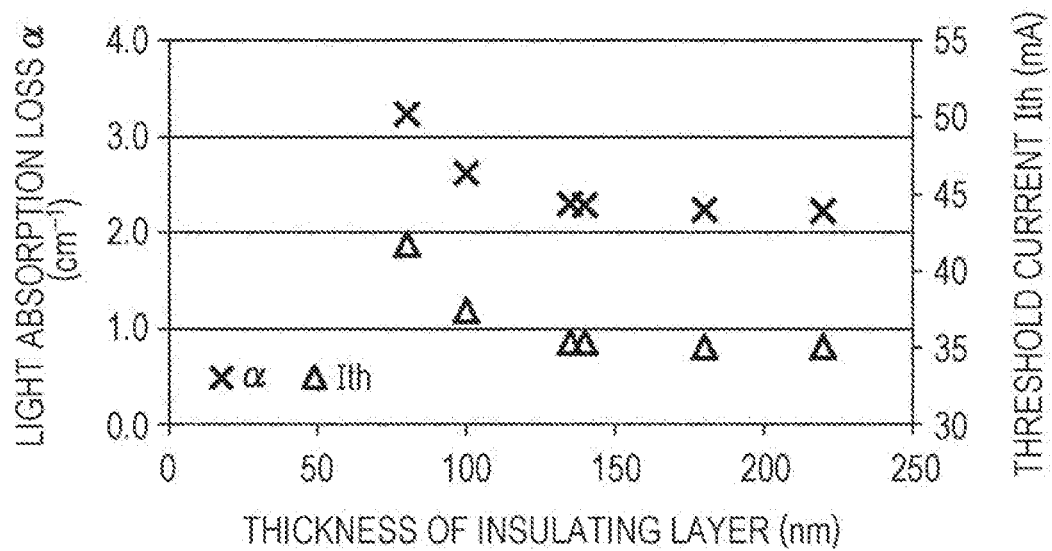
FIG. 3B is a graph illustrating a correlation among the thickness of an insulating layer, the light absorption loss, and the threshold current of the semiconductor laser element according to the first embodiment.

FIG. 3B is a graph illustrating the correlation among the thickness of an insulating layer, the light absorption loss α, and the threshold current Ith of a semiconductor laser element including a single ridge waveguide in a case where the insulating layer is made of $SiO_2$. The threshold current Ith is proportional to the threshold current density, provided that the area of a region in the light emitting portion into which a current is injected is the same. As illustrated in FIG. 3B, as the thickness of the insulating layer increases, the light absorption loss α decreases. In accordance with this, the threshold current Ith also decreases.

In the present embodiment, because the thicknesses of the insulating layers 28 of the light emitting portion 11a and the light emitting portion 11b are different from each other as illustrated in FIGS. 4A and 4B, the light absorption losses of the light emitting portion 11a and the light emitting portion 11b are also different from each other. Accordingly, the threshold current densities of the light emitting portion 11a and the light emitting portion 11b are different from each other. Therefore, from the relationship illustrated in FIG. 3A, the light emitting portion 11a and the light emitting portion 11b can emit laser beams having different wavelengths.

With such a semiconductor laser element 1, in accordance with the number of light emitting portions 11 included in the semiconductor laser element 1, a plurality of laser beams having different wavelengths can be emitted from one semiconductor laser element 1. Because a plurality of laser beams having different wavelengths are emitted from the semiconductor laser element 1, for example, in a case where the semiconductor laser element 1 is used in a laser scanning projector, speckle noise that is generated when laser beams are projected onto a projection surface can be reduced. A plurality of laser beams emitted by the semiconductor laser element 1 and having different wavelengths can be combined by using a dispersive optical element such as a prism. This is because, with such an optical element, laser beams having different wavelengths can be independently operated.

Method of Manufacturing Semiconductor Laser Element 1

A method of forming a multilayer structure of the semiconductor laser element 1 will be described. First, on the GaN substrate 21, the n-type semiconductor layers 22 and 23, the active region 24, and the p-type semiconductor layers 25 to 27 are stacked in order. Stacking of these semiconductor layers is performed by using an epitaxial growth method, a metal organic chemical vapor deposition (MOCVD) method, a molecular beam epitaxy (MBE) method, or the like.

After the semiconductor layers 22 to 27 have been stacked, a protrusion, which is to become a part of the ridge waveguide 12, is formed. The protrusion is formed, for example, by processing the p-type cladding layer 26 and the p-type contact layer 27 so as to have a desirable shape by performing lithography and an etching process. At this time, the p-type contact layer 27 remains only on the surface of the ridge waveguide 12.

Next, the insulating layer 28 is stacked by using a chemical vapor deposition (CVD) method, a sputtering method, or a vapor deposition method. Next, the thickness of the insulating layer 28 is reduced in at least one of the light emitting portion 11a and the light emitting portion 11b so that the thicknesses of the insulating layers 28 in the light emitting portion 11a and the light emitting portion 11b become different from each other. Moreover, the insulating layer 28 is removed from the surface of the p-type contact layer 27. The reduction in thickness and the removal of the insulating layer 28 are performed by using, for example, ordinary lithography or an etching process. Lastly, the metal layer 29 is stacked.

Although not illustrated, a layer made of Pd or Ni may be inserted so as to be interposed between and in contact with the p-type contact layer 27 and the metal layer 29 in an upper part of the ridge waveguide 12. By providing such a layer, the contact resistance can be reduced.

With such a method, the semiconductor laser element 1, in which a plurality of light emitting portions that can emit a plurality of laser beams having different wavelengths are included in a single element, can be manufactured inexpensively and easily by using a general layer-stacking method and a general processing method. Moreover, it is easy to adjust the wavelength of each of the laser beams emitted from the semiconductor laser element 1.

Modification

Figure 5:
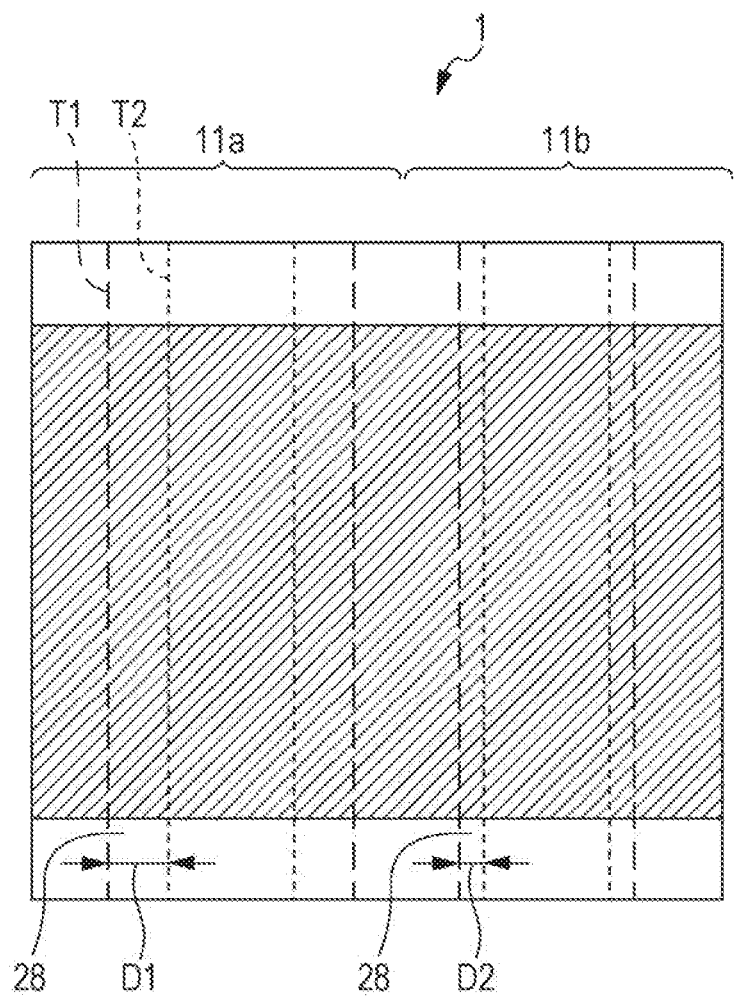
FIG. 5 schematically illustrates the thickness of an insulating layer of the semiconductor laser element according to the first embodiment.
Figure 6:
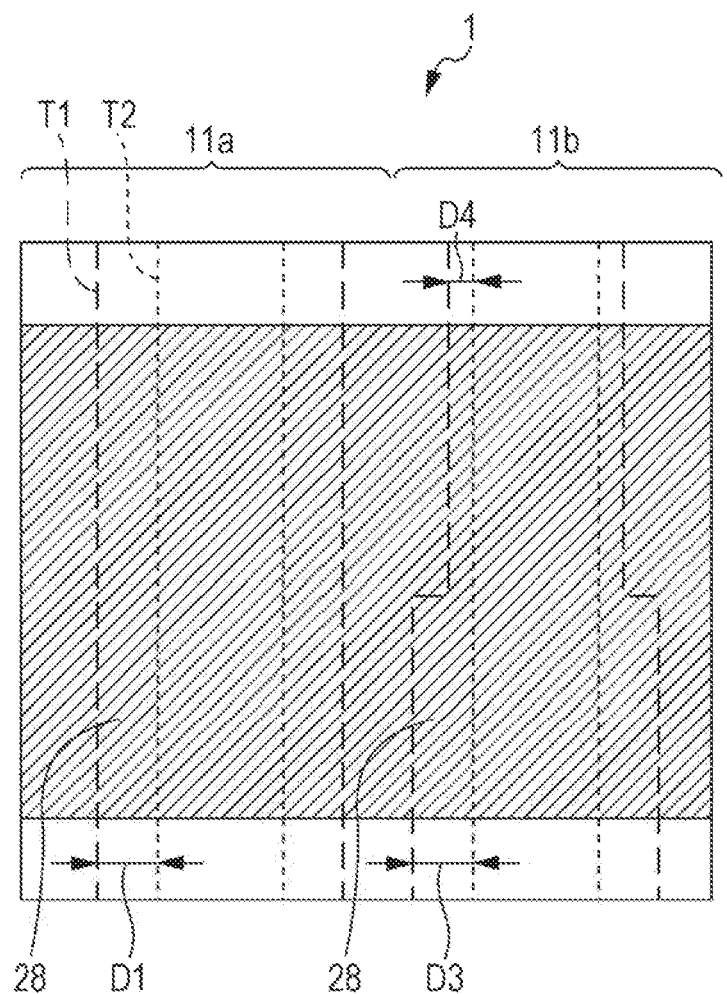
FIG. 6 schematically illustrates the thickness of an insulating layer of a semiconductor laser element according to a modification of the first embodiment.

FIG. 5 schematically illustrates the thickness of the insulating layer 28 when the semiconductor laser element 1 is viewed from the metal layer 29 side. FIG. 6 schematically illustrates the thickness of the insulating layer 28 when a semiconductor laser element 1 according to a modification is viewed from the metal layer 29 side. In FIG. 5 and FIG. 6, a boundary line T1 indicates a boundary line between the insulating layer 28 and the metal layer 29 at a side surface of the ridge waveguide 12, and a boundary line T2 indicates a boundary line between the semiconductor layers 26 and 27 and the insulating layer 28 at a side surface of the ridge waveguide 12.

As illustrated in FIG. 5, in the semiconductor laser element 1 according to the present embodiment, although the thickness D1 of the insulating layer 28 in the longitudinal direction of the light emitting portion 11a and the thickness D2 of the insulating layer 28 in the longitudinal direction of the light emitting portion 11b are different from each other, the thickness D2 is constant in the longitudinal direction of the light emitting portion 11b. On the other hand, as illustrated in FIG. 6, in the semiconductor laser element 1 according to the modification, although the thickness D1 and the thickness D4 of a part of the insulating layer 28 in the longitudinal direction of the light emitting portion 11b are different from each other, the thickness D3 of the remaining part of the insulating layer 28 in the longitudinal direction of the light emitting portion 11b is the same as the thickness D1.

That is, the thickness of the insulating layer 28 in the longitudinal direction of the light emitting portion 11b need not be constant, and the thickness of only a part of the insulating layer 28 may be different from the thickness D1. In other words, in the semiconductor laser element 1, among the plurality of light emitting portions 11, the thickness of a part of the insulating layer 28 of at least one of light emitting portions (for example, the light emitting portion 11a) may be different from the thickness of the insulating layer 28 of another of the light emitting portions (for example, the light emitting portion 11b), or the thickness of the entirety of the insulating layer 28 may be different from the thickness of the insulating layer 28 of another of the light emitting portions (for example, the light emitting portion 11b).

In the case where the thickness of only a part of the insulating layer 28 differs between the light emitting portion 11a and the light emitting portion 11b, the light absorption loss differs between the light emitting portion 11a and the light emitting portion 11b. Therefore, the threshold current densities of the light emitting portion 11a and the light emitting portion 11b are different from each other. Accordingly, the light emitting portion 11a and the light emitting portion 11b can emit laser beams having different wavelengths. With such a structure, the wavelengths of laser beams emitted by the light emitting portion 11 can be more finely adjusted.

Second Embodiment

Figure 7:
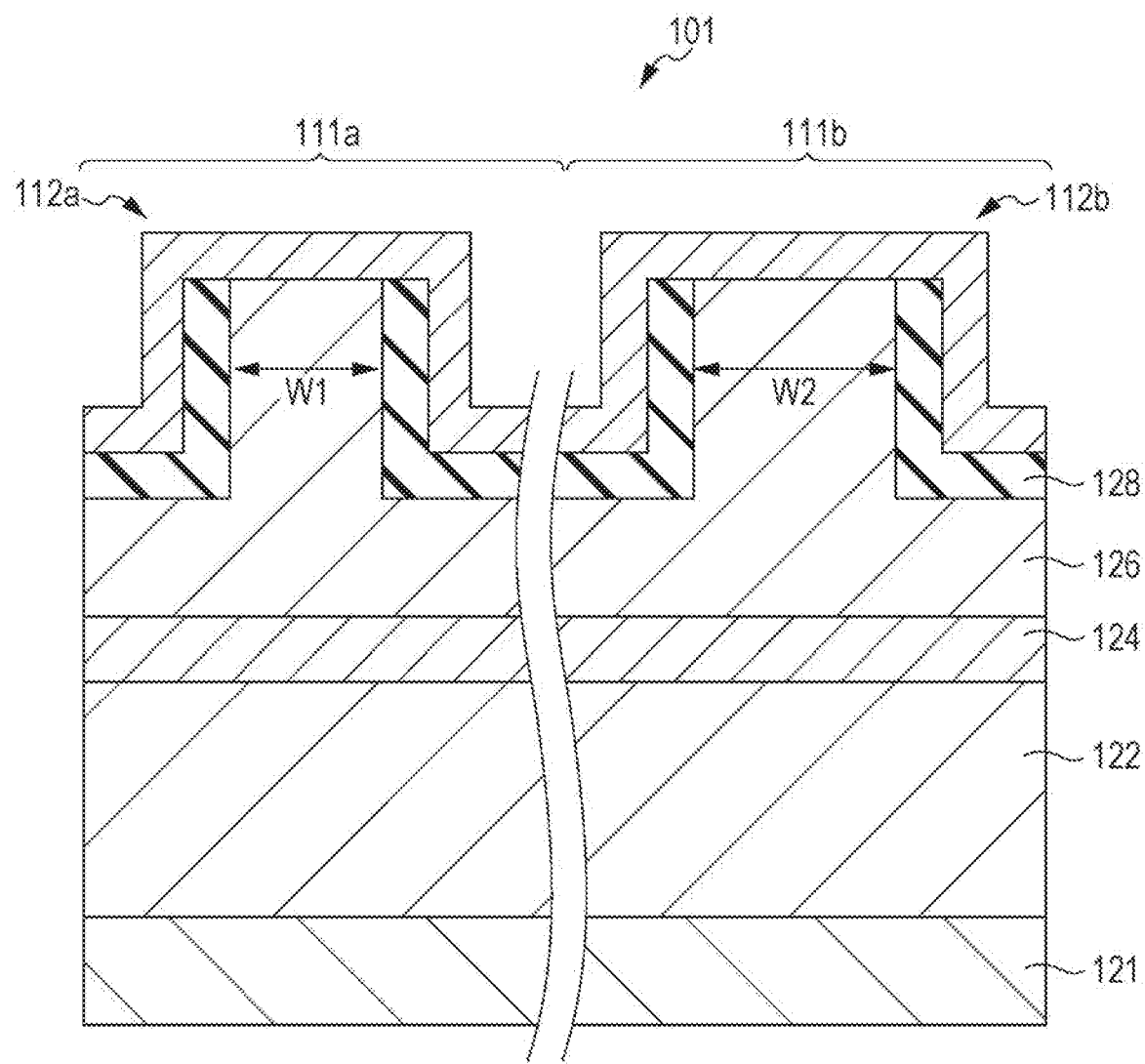
FIG. 7 is a sectional view schematically illustrating a cross-sectional structure of a semiconductor laser element according to a second embodiment.
Figure 8A:
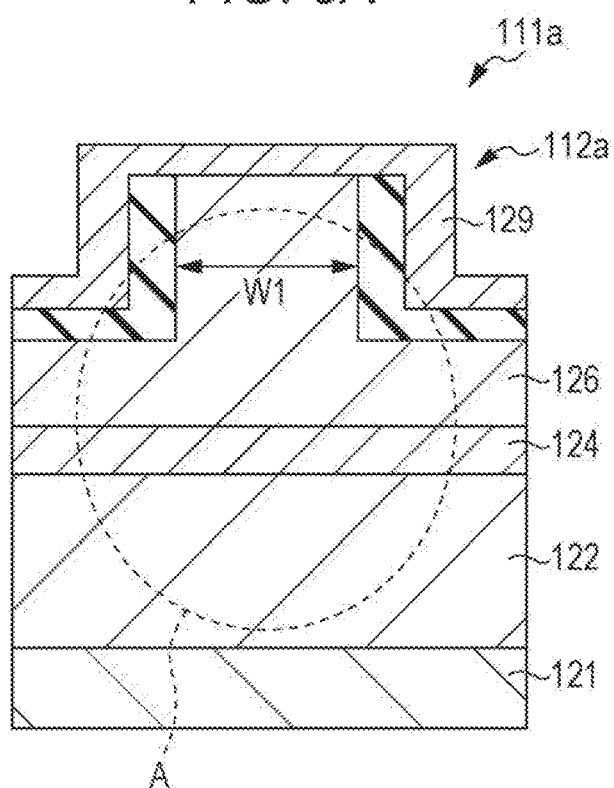
FIG. 8A is a sectional view schematically illustrating a cross-sectional structure of one light emitting portion of the semiconductor laser element according to the second embodiment.
Figure 8B:
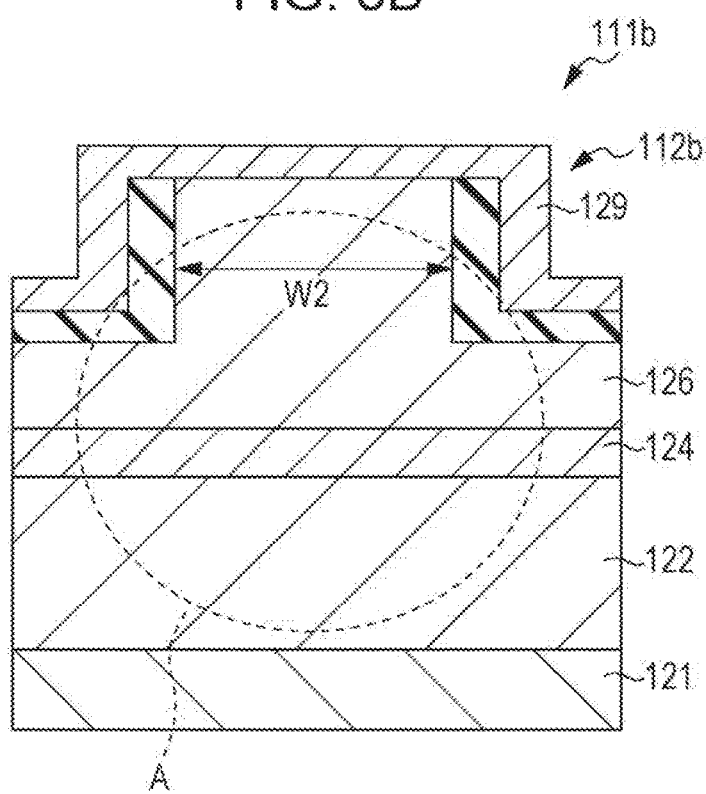
FIG. 8B is a sectional view schematically illustrating a cross-sectional structure of the other light emitting portion of the semiconductor laser element.
Figure 9:
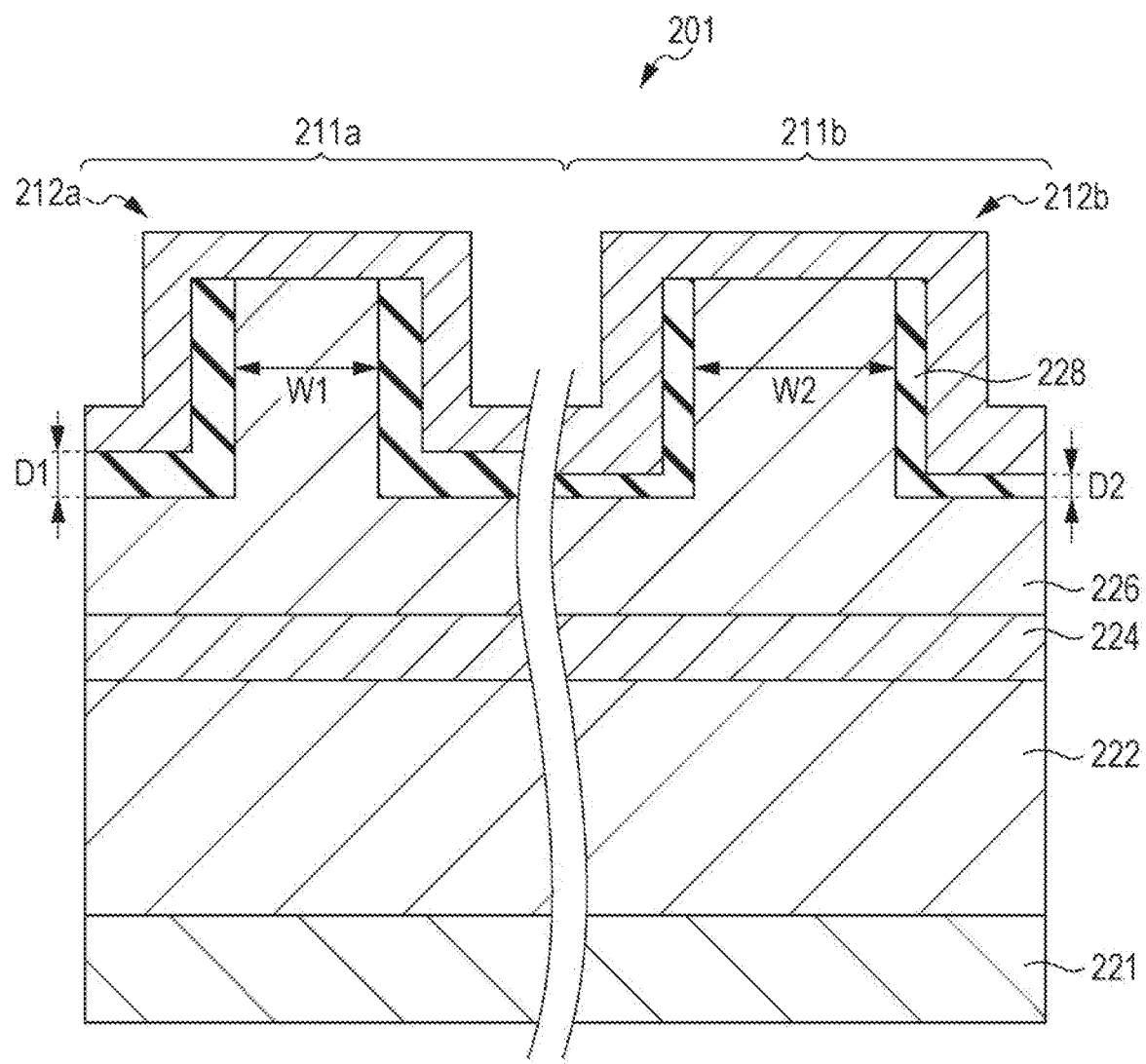
FIG. 9 is a sectional view schematically illustrating a cross-sectional structure of a semiconductor laser element according to a modification of the second embodiment.

Referring to FIGS. 7 to 9, another embodiment of the present disclosure will be described. FIG. 7 is a sectional view schematically illustrating a cross-sectional structure of a semiconductor laser element 101 according to the present embodiment. As illustrated in FIG. 7, the semiconductor laser element 101 differs from the semiconductor laser element 1 according to the first embodiment in that the width W1 of a p-type semiconductor layer 126 of a ridge waveguide 112a of a light emitting portion 111a differs from the width W2 of a p-type semiconductor layer 126 of a ridge waveguide 112b of a light emitting portion 111b, although the thicknesses of insulating layers 128 of the light emitting portion 111a and the light emitting portion 111b are the same.

In other words, in the semiconductor laser element 101, among a plurality of ridge waveguides 112, the width of the p-type semiconductor layer 126 of at least one of the ridge waveguides (for example, the ridge waveguide 112a) is different from the width of the p-type semiconductor layer 126 of another of the ridge waveguides (for example, the ridge waveguide 112b).

In the present description, the light emitting portion 111a and the light emitting portion 11b may be collectively referred to as a light emitting portion 111. The ridge waveguide 112a and the ridge waveguide 112b may be collectively referred to as a ridge waveguide 112.

In the present embodiment, preferably, the thickness of the insulating layer 128 is 50 nm or larger and 300 nm or smaller. A thickness in such a range is preferable, because, with such a range, the trade-off between the difference in oscillation wavelength between the light emitting portions 111a and 111b according to the present embodiment and the laser emission efficiency is optimal.

Principle Behind Emission of Laser Beams Having Different Wavelengths

FIG. 8A is a sectional view schematically illustrating a cross-sectional structure of the light emitting portion 111a, and FIG. 8B is a sectional view schematically illustrating a cross-sectional structure of the light emitting portion 111b. As illustrated in FIGS. 8A and 8B, because the width W1 is different from the width W2, among the light emitting portion 111a and the light emitting portion 111b, the distance in at least one of the light emitting portions (for example, the light emitting portion 111a) from a specific position in an active region 124 to a part or the entirety of an inner surface of a metal layer 129 is different from the distance in another of the light emitting portions (for example, the light emitting portion 111b) from the specific position to the inner surface of the metal layer 129. The specific position is a position in the active region 124 to which carriers are injected and at which light is generated. Because the width W1 and the width W2 are different, the light confinement efficiency of the light emitting portion 111b is different from that of the light emitting portion 111a.

Here, the light confinement efficiency influences the threshold current density as the light absorption loss does. Thus, because the light absorption loss and the light confinement efficiency differ between the light emitting portion 111a and the light emitting portion 111b, the threshold current densities of the light emitting portion 111a and the light emitting portion 111b differ from each other. Accordingly, the light emitting portion 111a and the light emitting portion 111b can emit laser beams having different wavelengths.

Regarding Crosstalk Between Light Beams Emitted from Light Emitting Portions

In order to reduce fluctuations in the output power of laser beams emitted from the light emitting portion 111a and the light emitting portion 111b, preferably, the crosstalk between light beams emitted from the light emitting portions is reduced. For this purpose, preferably, the distance W0 between two side surfaces, which face each other, of the p-type semiconductor layer 126 in the two adjacent ridge waveguides 112a and 112b is a predetermined length or larger. In this case, a laser beam emitted from one light emitting portion (for example, the light emitting portion 11a) is sufficiently absorbed by a semiconductor layer that is present between the light emitting portions 111 before the laser beam propagates to the other light emitting portion (for example, the light emitting portion 111b). Preferably, the distance W0 is 20 μm or larger and 50 μm or smaller.

Method of Manufacturing Semiconductor Laser Element 101

A method of manufacturing the semiconductor laser element 101 is the same as that in the first embodiment until a protrusion that is to become the ridge waveguide 112 is formed after semiconductor layers, which are an n-type semiconductor layer 122, the active region 124, and the p-type semiconductor layer 126, are stacked on a substrate 121. Next, the ridge waveguide 112a and the ridge waveguide 112b are adjusted so as to respectively have widths W1 and W2 in the transversal direction, which are different from each other, by using an ordinary lithography process.

Next, the insulating layer 128 is stacked by using a chemical vapor deposition (CVD) method, a sputtering method, or a vapor deposition method. Subsequently, the insulating layer 128 is stacked; the insulating layer 128 is removed from the upper surface of the ridge waveguide 112 by performing lithography, an etching process, or the like; and the metal layer 129 is further stacked. Although not illustrated, a layer made of Pd or Ni may be inserted so as to be interposed between and in contact with the p-type contact layer (not shown) and the metal layer 129 in an upper part of the ridge waveguide 112. By providing such a layer, contact resistance can be reduced.

With such a method, the semiconductor laser element 101, in which a plurality of light emitting portions that can emit a plurality of laser beams having different wavelengths are included in a single element, can be manufactured inexpensively and easily by using a general layer-stacking method and a general processing method. Moreover, it is easy to adjust the wavelength of each of the laser beams emitted from the semiconductor laser element 101.

Modification

FIG. 9 is a sectional view schematically illustrating a cross-sectional structure of a semiconductor laser element 201, which is a modification of the semiconductor laser element 101. As illustrated in FIG. 9, in the semiconductor laser element 201, the thicknesses D1 and D2 of insulating layers 228 may differ between a light emitting portion 211a and a light emitting portion 211b. That is, the semiconductor laser element 201 may have a structure that can emit laser beams having different wavelengths from the light emitting portion 211a and the light emitting portion 211b due to both of the difference between the widths W1 and W2 of p-type semiconductor layers 226 and the difference between the thicknesses D1 and D2 of the insulating layers 228 of a ridge waveguide 212a and a ridge waveguide 212b.

When the thickness D1 is larger than the thickness D2, preferably, the thickness D1 is 50 nm or larger and 300 nm or smaller. When the width W1 is smaller than the width W2, preferably, the width W1 is 0.8 µm or larger and 2.5 µm or smaller. Such a structure is preferable, because, with such a structure, the trade-off between the difference in oscillation wavelength between the light emitting portions 211a and 211b according to the present embodiment and the laser emission efficiency is optimal.

With such a structure, the difference between a plurality of laser beams emitted from the semiconductor laser element 201 can be increased. Moreover, it is easy to finely adjust the wavelength of each of the plurality of laser beams.

In the semiconductor laser elements 1, 101, and 201, among the plurality of light emitting portions 11, 111, and 211, the difference between the wavelength of a laser beam emitted from at least one of light emitting portions and the wavelength of a laser beam emitted from another of the light emitting portions is 1 nm or larger and 10 nm or smaller.

Third Embodiment

Figure 10A:
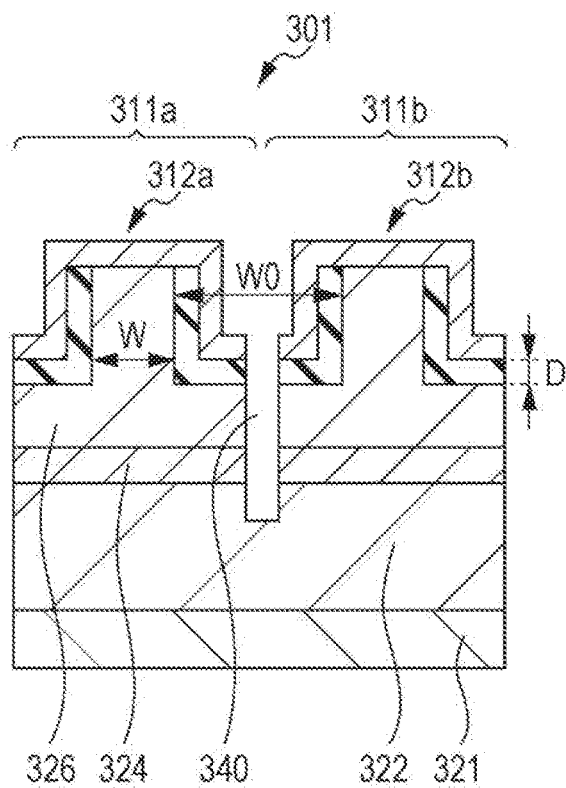
FIGS. 10A and 10B are cross-sectional views schematically illustrating cross-sectional structures of semiconductor laser elements each according to a third embodiment.
Figure 10B:
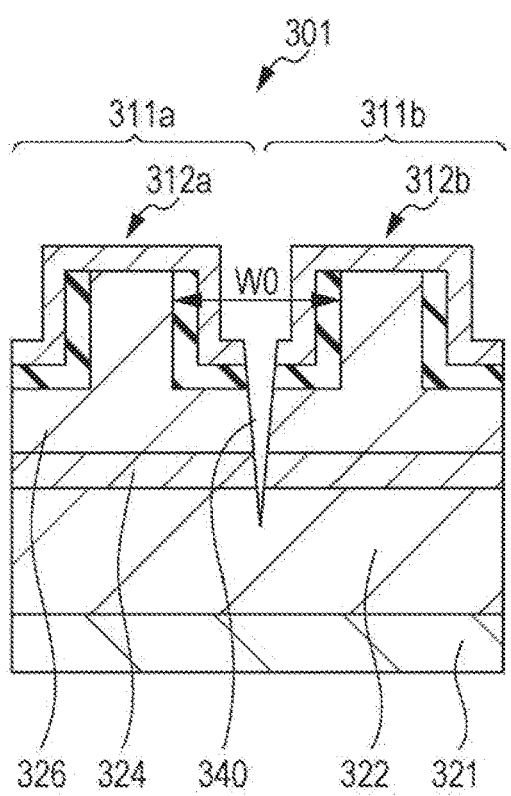
Figure 11A:
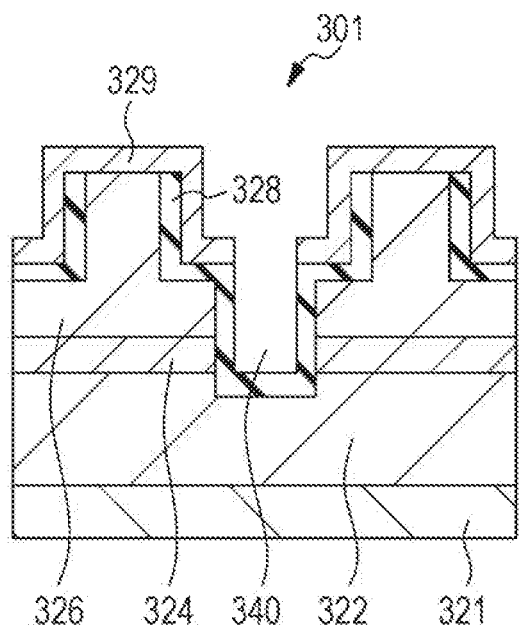
FIGS. 11A to 11D are cross-sectional views schematically illustrating cross-sectional structures of semiconductor laser elements each according to a third embodiment.
Figure 11B:
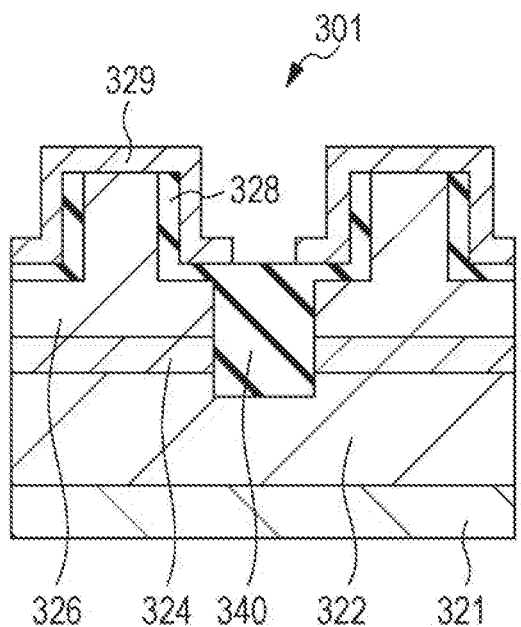
Figure 11C:
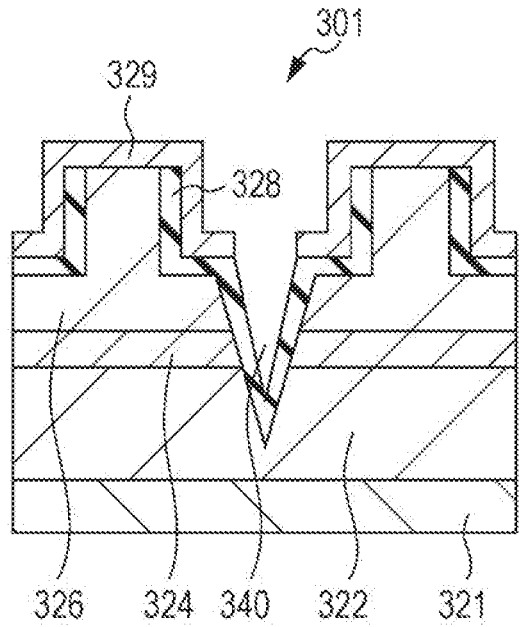
Figure 11D:
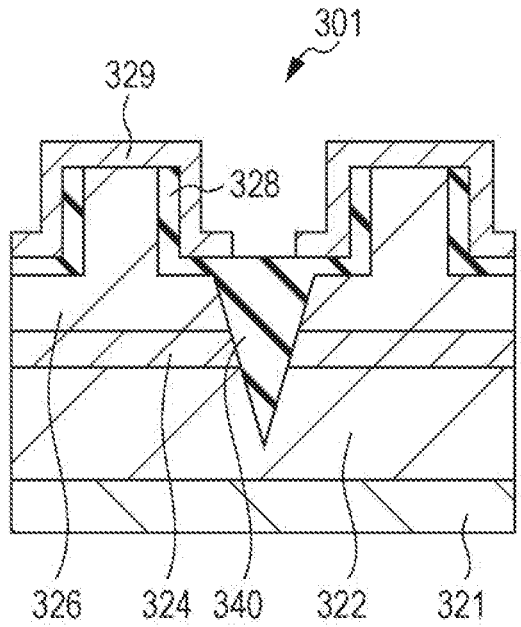

Referring to FIG. 10, another embodiment of the present disclosure will be described. FIGS. 10A and 10B and FIGS. 11A to 11D are each a sectional view schematically illustrating an example of a cross-sectional structure of a semiconductor laser element 301 according to the present embodiment. As illustrated in FIGS. 10A and 10B, the semiconductor laser element 301 differs from the semiconductor laser element 1 according to the first embodiment in that a groove (light propagation avoiding region) 340 is formed between a light emitting portion 311a and a light emitting portion 311b.

For convenience of drawing, FIG. 10 is illustrated in such a way that the thickness D of an insulating layer and the width W of a p-type semiconductor layer 326 of a ridge waveguide 312 do not differ between the light emitting portion 311a and the light emitting portion 311b. However, in the present embodiment, the thickness D and/or the width W differ between the light emitting portion 311a and the light emitting portion 311b. In other words, the semiconductor laser element 301 is configured by forming the groove 340 further in one of the semiconductor laser elements 1, 101, and 201.

As described in the first embodiment, when the groove 340 is not formed, in order to reduce fluctuations in the output power of laser beams emitted from the light emitting portion 11a and the light emitting portion 11b, preferably, the distance W0 between two side surfaces, which face each other, of the two adjacent ridge waveguides is 20 µm or larger and 50 µm or smaller. However, when the distance W0 is large, it is difficult to make the size of the semiconductor laser element 301 smaller than a certain size. Moreover, a new problem may arise in that, when the semiconductor laser element 1 is used in a laser scanning projector, the spatial separation of projection spots emitted from the light emitting portions is large and the resolution of a projected image decreases. Therefore, in the semiconductor laser element 301 according to the present embodiment, the groove 340 is newly formed between the light emitting portion 311a and the light emitting portion 311b.

Depth of Groove 340

The groove 340 is formed between the light emitting portion 311a and the light emitting portion 311b in order to reduce the crosstalk. Preferably, the groove 340 has a depth such that the groove 340 extends through an active region 324 so that the groove 340 can effectively suppress the crosstalk between the light emitting portion 311a and the light emitting portion 311b.

In other words, in the semiconductor laser element 301, a laser beam is emitted from the active region 324 that is formed in a portion of the semiconductor layer included in a part of the multilayer structure in a light emitting portion 311; when two of the light emitting portions 311 that are adjacent to each other in the plurality of light emitting portions are regarded as a set, in a region between the two light emitting portions 311 in at least one set of the light emitting portions 311, the groove 340 for avoiding propagation of a laser beam from the active region 324 of one of the light emitting portions (for example, 311a) to the active region 324 of another of the light emitting portions (for example, 311b) is formed; and the groove 340 is formed so as to extend from a surface of a metal layer 329 to at least a part of the semiconductor layer.

Method of Forming Groove 340

As illustrated in FIGS. 11A to 11D, preferably, the groove 340 is covered by a material that is the same as the material of an insulating layer 328 and/or the metal layer 329. In other words, in the semiconductor laser element 301, preferably, the groove 340 is formed from at least one of the materials of the insulating layer 328 and the metal layer 329.

With such a structure, the crosstalk can be more effectively suppressed. Moreover, when manufacturing the semiconductor laser element 301, by forming the groove 340 by performing an etching process or the like before stacking the insulating layer 328, and by subsequently stacking the insulating layer 328 and the metal layer 329, the groove 340 can be easily filled with a material that is the same as the material of the insulating layer 328 and/or the metal layer 329.

The distance W0 may be 8 µm or larger and 50 µm or smaller, because the crosstalk can be more effectively suppressed by forming the groove 340. In other words, in the semiconductor laser element 301, when two of the ridge waveguides 312 that are adjacent to each other are regarded as a set, the distance between two side surfaces, which face each other, of the p-type semiconductor layer 326 in ridge waveguides 312 of at least one set may be 8 μm or larger and 50 μm or smaller.

Thus, even in a case where it is necessary to reduce the distance W0 due to limitation on the size of the semiconductor laser element 301, it is possible to manufacture the semiconductor laser element 301 in which the crosstalk is sufficiently reduced.

EXAMPLES

Conditions

Examples 1 to 3 of the present disclosure will be described below. Tables 1 to 3 respectively show parameters in semiconductor laser elements according to Examples 1 to 3. The parameters are as follows: the thickness D of an insulating layer (unit: nm), the width W of a semiconductor layer in a ridge waveguide (unit: μm), the threshold current Ith in each light emitting portion (unit: mA), the reflectivities of front-side and rear-side cleaved facets of each light emitting portion (unit: %), and the resonator length L of each light emitting portion (unit: μm). Here, the term "front side" refers to a cleaved facet side from which a laser beam is emitted from a semiconductor laser element, and the term "rear-side" refers to a side opposite from the front side.

The semiconductor laser elements according to Examples 1 to 3 each included two light emitting portions (a light emitting portion A and a light emitting portion B). In Tables 1 to 3, Δ (delta) represents the difference in each parameter between the two light emitting portions. In Example 3, as in the first embodiment of the present disclosure, the thickness of the insulating layer differed between the light emitting portion A and only a part of the light emitting portion B in the longitudinal direction. Accordingly, only in Table 3, the length L1 of the part of the light emitting portion B in the longitudinal direction (unit: μm) is shown.

In each of the semiconductor laser elements according to Examples 1 to 3, the semiconductor layer was made of a (Al, Ga, In, N, As, P) material group, the insulating layer was made of SiO$_2$, and the metal layer was made of a material including Au, Ti, Pd, Pt, and Ni. From each of the semiconductor laser elements according to Examples 1 to 3, a laser beam having an optical power of 30 mW was emitted under a condition of 25° C.

TABLE 1

| Example 1 | Light Emitting Portion 1 | Light Emitting Portion 2 | Δ |
|---|---|---|---|
| D [nm] | 130 | 65 | −65 |
| W [μm] | 1.8 | 1.8 | 0 |
| I$_{th}$ [mA] | 8.1 | 10.9 | 2.7 |
| λ [nm] | 444.8 | 442.8 | −2 |
| Front-Side Reflectivity [%] | 81 | 81 | |
| Rear-Side Reflectivity [%] | 99 | 99 | |
| L [μm] | 600 | 600 | |

TABLE 2

| Example 2 | Light Emitting Portion 1 | Light Emitting Portion 2 | Δ |
|---|---|---|---|
| D [nm] | 140 | 140 | 0 |
| W [μm] | 1.85 | 1.25 | −0.6 |
| I$_{th}$ [mA] | 31.2 | 34.7 | 3.5 |

TABLE 2-continued

| Example 2 | Light Emitting Portion 1 | Light Emitting Portion 2 | Δ |
|---|---|---|---|
| λ [nm] | 519.7 | 518.7 | −1 |
| Front-Side Reflectivity [%] | 81 | 81 | |
| Rear-Side Reflectivity [%] | 99 | 99 | |
| L [μm] | 600 | 600 | |

TABLE 3

| Example 3 | Light Emitting Portion 1 | Light Emitting Portion 2 | Δ |
|---|---|---|---|
| D [nm] | 100 | 50 | −50 |
| W [μm] | 2 | 2 | 0 |
| I$_{th}$ [mA] | 37 | 50 | 13 |
| λ [nm] | 640 | 638.2 | −1.8 |
| Front-Side Reflectivity [%] | 10 | 10 | |
| Rear-Side Reflectivity [%] | 99 | 99 | |
| L [μm] | 1400 | 1400 | |
| L1 [μm] | n/a | 700 | |

Results

As shown in Tables 1 to 3, the threshold current Ith varied between the light emitting portion A and the light emitting portion B for the following reasons: in Example 1, the thickness of the insulating layer was varied; in Example 2, the width of the semiconductor layer in the ridge waveguide was varied; and in Example 3, the thickness of the insulating layer was varied in only a part of the light emitting portion in the longitudinal direction. Accordingly, in each of Examples 1 to 3, the wavelengths λ of laser beams emitted from the light emitting portion A and the light emitting portion B differed from each other by 1 nm or larger.

From the above results, it was shown that the semiconductor laser element according to the present disclosure can emit laser beams having wavelengths that differ from each other between a plurality of light emitting portions.

SUMMARY

A light emitting element (semiconductor laser element 1) according to a first aspect of the present disclosure is a light emitting element (semiconductor laser element 1) having a multilayer structure in which a substrate (21), a semiconductor layer (22 to 27), an insulating layer (28), and a metal layer (29) are stacked in order. The light emitting element includes a plurality of light emitting portions (11) each of which has a part of the multilayer structure and emits a laser beam. The plurality of light emitting portions (11) each include a ridge (ridge waveguide 12) including a part of each of the semiconductor layer (22 to 27), the insulating layer (28), and the metal layer (29). In each of the plurality of ridges (ridge waveguides 12), in a sectional view defined by a direction parallel to a surface of the metal layer, parts of the insulating layer (28) are disposed on both sides of a part of the semiconductor layer (22 to 27), and parts of the metal layer (29) are disposed on both sides of a part of the insulating layer (28). Among the plurality of light emitting portions (11), a distance in at least one of the light emitting portions (11) from a specific position in the active region (24) to a part or an entirety of an inner surface of the metal layer (29) is different from a distance in another of the light emitting portions (11) from the specific position to the inner surface of the metal layer (29).

With the above structure, because the threshold current densities of the plurality of light emitting portions are different from each other, a plurality of laser beams having different wavelengths can be emitted from a single light emitting element. Because a plurality of laser beams having different wavelengths are emitted from the light emitting element, for example, in a case where the light emitting element is used in a laser scanning projector, speckle noise that is generated when laser beams are projected onto a projection surface can be reduced.

In a light emitting element (semiconductor laser element 1) according to a second aspect of the present disclosure, in the first aspect, at least one of (i) and (ii) may be satisfied: (i) among the plurality of light emitting portions (11), a thickness of a part or an entirety of the insulating layer (28) in at least one of the light emitting portions (11) is different from a thickness of the insulating layer (28) in another of the light emitting portions (11); and (ii) among the plurality of ridges (ridge waveguides 12), a width of the semiconductor layer (22 to 27) in at least one of the ridges (ridge waveguide 12) is different from a width of the semiconductor layer (22 to 27) in another of the ridges (ridge waveguide 12).

With the above structure, because the threshold current densities of the plurality of light emitting portions are different from each other, a plurality of laser beams having different wavelengths can be emitted from a single light emitting element. Because a plurality of laser beams having different wavelengths are emitted from the light emitting element, for example, in a case where the light emitting element is used in a laser scanning projector, speckle noise that is generated when laser beams are projected onto a projection surface can be reduced.

In a light emitting element (semiconductor laser element 1) according to a third aspect of the present disclosure, in the first or second aspect, a light absorption coefficient of the insulating layer (28) may be $\frac{1}{100}$ of a light absorption coefficient of the metal layer or lower. With the above structure, the insulating layer does not significantly influence the light absorption loss of the light emitting portion.

In a light emitting element (semiconductor laser element 1) according to a fourth aspect of the present disclosure, in any one of the first to third aspects, among the plurality of light emitting portions (11), a difference between a wavelength of the laser beam emitted from at least one of the light emitting portions (11) and a wavelength of the laser beam emitted from another of the light emitting portions (11) may be 1 nm or larger and 10 nm or smaller. With the above structure, the light emitting element can emit a plurality of laser beams having different wavelengths.

In a light emitting element (semiconductor laser element 1) according to a fifth aspect of the present disclosure, in any one of the first to fourth aspects, when two of the ridges (ridge waveguides 12) that are adjacent to each other in the plurality of ridges (ridge waveguides 12) are regarded as a set, a distance between two side surfaces, which face each other, of the semiconductor layer (22 to 27) in at least one set of the ridges (ridge waveguide 12) may be 8 μm or larger and 50 μm or smaller.

With the above structure, before a laser beam emitted from one light emitting portion propagates to the other light emitting portion, the laser beam can be sufficiently absorbed by the semiconductor layer that is present between the light emitting portions. Accordingly, fluctuations in the output power of laser beams emitted from a plurality of light emitting portions can be reduced.

A light emitting element (semiconductor laser element 301) according to a sixth aspect of the present disclosure may be configured as follows in one of the first to fifth aspects: the laser beam is emitted by stimulated emission in the active region (324) that is formed in a portion of the semiconductor layer included in a part of the multilayer structure in each of the light emitting portions (311); when two of the light emitting portions (311) that are adjacent to each other in the plurality of light emitting portions (311) are regarded as a set, in a region between the two light emitting portions (311) in at least one set of the light emitting portions (311), a light propagation avoiding region (groove 340) for avoiding propagation of the laser beam from the active region (324) of one of the light emitting portions (311) to the active region (324) of the other light emitting portion (311) is formed; and the light propagation avoiding region (groove 340) is formed so as to extend from a surface of the metal layer (329) to at least a part of the semiconductor layer.

With the above structure, due to the light propagation avoiding region, before a laser beam emitted from one of the light emitting portions propagates to the other light emitting portion, the laser beam can be sufficiently absorbed by the light propagation avoiding region. Accordingly, the distance between a plurality of light emitting portions can be reduced.

In a light emitting element (semiconductor laser element 301) according to a seventh aspect of the present disclosure, in the sixth aspect, the light propagation avoiding region (groove 340) may be formed from at least one of a material of the insulating layer (328) and a material of the metal layer (329).

With the above structure, a light propagation avoiding region that can more effectively suppress propagation of light can be formed by using a simple method.

Additional Remarks

The present disclosure is not limited to the embodiments described above and may be modified in various ways within the scope shown in the claims, and embodiments obtained by combining technical units disclosed in different embodiments are also included in the technical scope of the present disclosure. Further, a new technical feature can be formed by combining technical units disclosed in each of the embodiments.

The present disclosure contains subject matter related to that disclosed in U.S. Provisional Application No. 62/792, 148 filed in the U.S. Patent and Trademark Office on Jan. 14, 2019, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A light emitting element having a multilayer structure in which a substrate, a semiconductor layer, an insulating layer, and a metal layer are stacked in order, the light emitting element comprising a plurality of light emitting portions each of which has a part of the multilayer structure and emits a laser beam, wherein the plurality of light emitting portions each include a ridge including a part of the semiconductor layer, a part of the insulating layer, and a part of the metal layer, and an active region, for emitting the laser beam by stimulated emission, is formed in the semiconductor layer included in a part of the multilayer structure, wherein, in each of the plurality of ridges, in a sectional view defined by a direction parallel to a surface of the metal layer, parts of the insulating layer are disposed on both sides of a part of the semiconductor layer, and parts of the metal layer are disposed on both sides of a part of the insulating layer, wherein, among the plurality of light emitting portions, a thickness of a part or an entirety of the insulating layer in at least one of the light emitting portions is different from a thickness of the insulating layer in another of the light emitting portions, and wherein, among the plurality of light emitting portions, a distance in at least one of the light emitting portions from a specific position in the active region to a part or an entirety of an inner surface of the metal layer is different from a distance in another of the light emitting portions from the specific position to the inner surface of the metal layer.

2. The light emitting element according to claim 1, wherein, among the plurality of ridges, a width of the semiconductor layer in at least one of the ridges is different from a width of the semiconductor layer in another of the ridges.

3. The light emitting element according to claim 1, wherein a light absorption coefficient of the insulating layer is $1/100$ of a light absorption coefficient of the metal layer or lower.

4. The light emitting element according to claim 1, wherein, among the plurality of light emitting portions, a difference between a wavelength of the laser beam emitted from at least one of the light emitting portions and a wavelength of the laser beam emitted from another of the light emitting portions is 1 nm or larger and 10 nm or smaller.

5. The light emitting element according to claim 1, wherein, when two of the ridges that are adjacent to each other in the plurality of ridges are regarded as a set, a distance between two side surfaces, which face each other, of the semiconductor layer in at least one set of the ridges is 8 μm or larger and 50 μm or smaller.

6. The light emitting element according to claim 1, wherein the laser beam is emitted by stimulated emission in the active region that is formed in a portion of the semiconductor layer included in a part of the multilayer structure in each of the light emitting portions, wherein, when two of the light emitting portions that are adjacent to each other in the plurality of light emitting portions are regarded as a set, in a region between the two light emitting portions in at least one set of the light emitting portions, a light propagation avoiding region for avoiding propagation of the laser beam from the active region of one of the light emitting portions to the active region of the other light emitting portion is formed, and wherein the light propagation avoiding region is formed so as to extend from a surface of the metal layer to at least a part of the semiconductor layer.

7. The light emitting element according to claim 6, wherein the light propagation avoiding region is formed from at least one of a material of the insulating layer and a material of the metal layer.

* * * * *